United States Patent
Tamou et al.

(10) Patent No.: US 6,440,562 B1
(45) Date of Patent: Aug. 27, 2002

(54) TUNGSTEN SUPER FINE PARTICLE AND METHOD FOR PRODUCING THE SAME

(75) Inventors: Yoshitaka Tamou; Shun-ichiro Tanaka; BingShe Xu, all of Kanagawa-ken (JP)

(73) Assignees: Kabushiki Kaisha Toshiba, Kawasaki; Japan Science and Technology Corporation, Kawaguchi, both of (JP)

( * ) Notice: Subject to any disclaimer, the term of this patent is extended or adjusted under 35 U.S.C. 154(b) by 0 days.

(21) Appl. No.: 09/646,831

(22) PCT Filed: Mar. 19, 1999

(86) PCT No.: PCT/JP99/01393

§ 371 (c)(1),
(2), (4) Date: Sep. 22, 2000

(87) PCT Pub. No.: WO99/49099

PCT Pub. Date: Sep. 30, 1999

(30) Foreign Application Priority Data

Mar. 25, 1998 (JP) .................................... 10-077799

(51) Int. Cl.⁷ .............................................. B32B 15/02
(52) U.S. Cl. .................... 428/408; 75/255; 148/423
(58) Field of Search .................. 75/255; 420/430; 148/423; 428/408

(56) References Cited

U.S. PATENT DOCUMENTS

| | | | |
|---|---|---|---|
| 5,403,375 A | * 4/1995 | Konig et al. | 75/255 |
| 5,772,754 A | 6/1998 | Tanaka et al. | 117/5 |
| 5,851,507 A | * 12/1998 | Pirzada et al. | 75/343 |
| 6,001,304 A | * 12/1999 | Yoo et al. | 419/10 |

FOREIGN PATENT DOCUMENTS

| | | |
|---|---|---|
| EP | 0 735 001 A2 | 10/1996 |
| JP | 60-24305 | 2/1985 |
| JP | 2-6339 | 1/1990 |
| JP | 3-56607 | 3/1991 |
| JP | 03-056607 | 3/1991 |
| JP | 06-020518 | 1/1994 |
| JP | 8-217419 | 8/1996 |
| JP | 09-309798 | 12/1997 |
| JP | 09-316504 | 12/1997 |

OTHER PUBLICATIONS

S. Iwama et al.; "Preparation of Ultrafine Mo And W Particles By The Gas Evaporation Technique With Electron Beam Heating", Surface Science, vol. 156, No. 1, pp. 85–89, (1985).

ASM Handbook, vol. 2, Properties and Selection, p. 1170, ASM 1990.*

ASM Handbook, vol. 7, Powder Metal Technologies and Applications, pp. 77–79, 188–195, 903–908, ASM, 1998.*

* cited by examiner

Primary Examiner—George Wyszomierski
(74) Attorney, Agent, or Firm—Finnegan, Henderson, Farabow, Garrett & Dunner, L.L.P.

(57) ABSTRACT

A particle of W oxide 2 such as a particle of $WO_3$ is disposed on an amorphous carbon support film 1, onto the particle of W oxide 2 in an atmosphere of high vacuum an electron beam of an intensity of $10^{23}$ to $10^{24}$ e/cm²·sec being irradiated. Due to the irradiation of an electron beam 3 of such an intensity, ultra fine particles of W 4 of a particle diameter of for instance 10 nm or less are generated. The ultra fine particles of W consist of W effected to detach from the particle of W oxide.

6 Claims, 2 Drawing Sheets

TUNGSTEN SUPER FINE PARTICLE AND METHOD FOR PRODUCING THE SAME

TECHNICAL FIELD

The present invention relates to ultra fine particles of Tungsten(W) and a method for producing the same.

BACKGROUND ART

Metal particles show properties different from that of ordinary ones (of 1 μm or more, for instance) when a diameter becomes ultra fine such as 100 nm or less. In the ultra fine particle, since a number of atoms on the surface thereof increases relative to the total number of atoms, an influence of surface energy on properties of the particle can not be neglected. Further, an influence due to residual strain that is a problem in an ordinary bulk material can be avoided. Thereby, the ultra fine particles show various kinds of excellent properties.

The ultra fine particles show properties different from that of a bulk such as that for instance a melting point and sintering temperature thereof become lower compared with that of the bulk, and, in some cases, hardness becomes higher compared with that of the bulk. Further, when a plurality of ultra fine particles exists, there is a likelihood that a tunneling effect occurs therebetween, or a quantum mechanical effect such as quantum well, mini-band, quantum wire or the like appears. Further, the ultra fine particles, depending on the type thereof, have an excellent function of various kinds of materials such as obtaining high catalytic activity. Thus, the ultra fine particles are excellent in various kinds of properties such as chemical, mechanical, electrical, thermal properties and so on.

By making the best use of the excellent properties that the ultra fine particles of nano-order have, various kinds of materials can be improved in properties thereof and various kinds of devices and catalysts can be applied to functional materials. Accordingly, the study of physical properties and applications of the ultra fine particles is in progress. Further, if an agglomerate thereof maintaining characteristics of the ultra fine particle of nano-order, for instance, a nano-crystal thin film can be obtained, a likelihood of applications as the device material and functional material is expected to become even higher.

Now, as existing methods of producing the ultra fine particles, there are known physical and chemical methods shown in the following. That is, as the physical methods for producing the ultra fine particles, a gas phase condensation method, a sputtering method, a metal evaporation synthesis method, a vacuum evaporation method on a fluid oil can be cited. As the chemical methods for producing the ultra fine particles that make use of a liquid phase, a colloidal method, an alkoxide method, a co-precipitation method or the like can be cited. As the chemical methods for producing the ultra fine particles that make use of a gaseous phase, an organometallic compound pyrolysis method, a metal chloride reducing/nitridation method, a reduction method in hydrogen, a solvent evaporation method can be cited.

All the aforementioned existing methods for producing the ultra fine particles are ones that obtain the ultra fine particles as agglomerates, that is, ultra fine powders. Accordingly, these methods are unsuitable for studying properties and applications as a single ultra fine particle.

By contrast, inventors of the present invention previously proposed a method of generating Al ultra fine particles in which an electron beam of an intensity of approximately $1 \times 10^{20}$ e/cm$^2$·sec is irradiated on an Al oxide particle in an atmosphere of a high vacuum to generate Al ultra fine particles (cf. Japanese Patent Laid-open Application No. HEI 8-217419). According to the method, the Al ultra fine particles can be obtained as a single particle, further the shape and crystal orientation thereof can be controlled.

However, since the aforementioned method has been developed only for the Al ultra fine particles, conditions of production of the ultra fine particles are not necessarily suitable for all kinds of metals.

For instance, W is known as a refractory metal. If ultra fine particles of W satisfying both such material properties of W and properties based on the ultra fine particles can be obtained, applications to usage different from the Al ultra fine particles can be expected. However, Al pertaining to light metals and W that is one of elements of particularly large atomic weight among heavy metals show largely different behavior in irradiating an electron beam on oxide particles thereof. Accordingly, even if the aforementioned conditions for producing the Al ultra fine particles are simply applied to the W ultra fine particles, excellent W ultra fine particles can not be obtained with good reproducibility. This hinders the W ultra fine particles from being applied to devices and various kinds of function materials. From the above, development of conditions for producing ultra fine particles that enable to obtain W ultra fine particles with reproducibility is in demand.

In addition, if an agglomerate maintaining properties of ultra fine particles of nano-order, for instance, a nano-crystal thin film is obtained, realization of applications in for instance device materials and function materials is highly expected to be further heightened. From the above, it is in demand to enable production of a nano-crystal thin film that uses W ultra fine particles.

There are existing general thin film formation methods such as a PVD method and CVD method typical in a vacuum deposition method, a laser ablation method, a sputtering method or the like. Furthermore, there are modified methods of the above ones such as a molecular beam epitaxy method (MBE method), a metal-organic vapor phase epitaxy method (MO-VPE method) or the like, in all of which controllability of the aforementioned methods are improved. In these general thin film formation methods, due to single-crystallization of the film caused by a substrate for film formation and non-uniformity in the initial stage of film formation, further due to crystal growth caused by heating of the substrate, it is extremely difficult to uniformly control the crystal size in nano-order.

The object of the present invention is to provide ultra fine particles of W capable of being operated and controlled in various ways as a single particle or a fused body, and a method for producing ultra fine particles of W that enable to obtain such ultra fine particles of W with good reproducibility.

DISCLOSURE OF THE INVENTION

The present inventors studied hard to obtain excellent ultra fine particles of W. As a result, it is found that in irradiating an electron beam on a particle of W oxide to produce ultra fine particles of W, the electron beam of an intensity in the range of $10^{23}$ to $10^{24}$ e/cm$^2$·sec is effective.

That is, in the case of an electron beam being irradiated on a particle of $WO_3$ or so on, when the intensity of the electron beam is less than $10^{23}$ e/cm$^2$·sec, energy is insufficient for debonding between W and oxygen atoms. In this case, only the inside of the particle of $WO_3$ is changed to a fine polycrystalline structure, ultra fine particles of W being not obtained from the particle of $WO_3$.

On the other hand, in the case of the intensity of the electron beam exceeding $10^{24}$ e/cm$^2$·sec, the particle of $WO_3$ is damaged due to the irradiation, ultra fine particles of W of excellent crystalline state being not obtained. It is considered that on these, an atomic weight of W and bonding energy between W and oxygen affect. In particular, the atomic weight is considered to largely affect thereon.

The present invention is based on such knowledge. Ultra fine particles of W of the present invention are ones that are formed through an irradiation of an electron beam on a particle of W oxide. It is characterized in that the ultra fine particles consist essentially of W that is derived from the particle of W oxide by irradiating the electron beam of an intensity of $10^{23}$ to $10^{24}$ e/cm$^2$·sec on the particle of W oxide in an atmosphere of a high vacuum.

The ultra fine particles of W of the present invention have a particle diameter of for instance a diameter of 10 nm or less. The ultra fine particles of the present invention can exist not only as a single particle of ultra fine particle of W but also as a bonded body of a plurality of ultra fine particles of W. As a concrete example of this case, a nano crystal thin film in which a plurality of ultra fine particles of W is bonded can be cited.

A method for producing ultra fine particles of W of the present invention comprises a step of disposing a particle of W oxide on an amorphous carbon film, and a step of irradiating an electron beam of an intensity of $10^{23}$ to $10^{24}$ e/cm$^2$·sec on the particle of W oxide in an atmosphere of a high vacuum to debond W atom from the particle of W oxide to form ultra fine particles of W.

In the present method for producing ultra fine particles of W, the ultra fine particles of W derived from the particle of W oxide, while sticking on the amorphous carbon film, can be bonded to each other. In the method of producing ultra fine particles of W of the present invention, an electron beam is preferable to be irradiated on a particle of W oxide in an atmosphere of $10^{-5}$ Pa or better.

MODES FOR IMPLEMENTING THE INVENTION

In the following, modes for implementing the present invention will be described.

Figure 1:
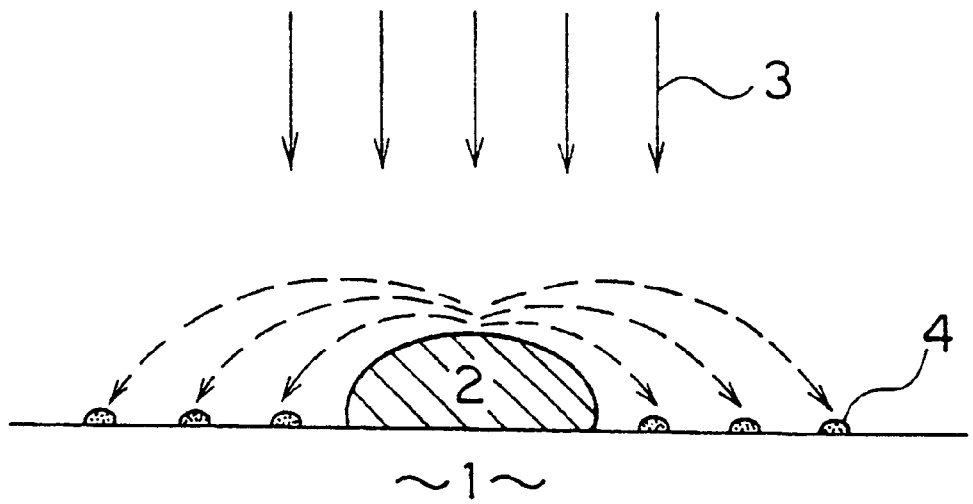
FIG. 1 is a diagram schematically showing a state of production of ultra fine particles of W of the present invention.

FIG. 1 is a diagram schematically showing a state of production of ultra fine particles of W of the present invention. In the figure, reference numeral 1 denotes an amorphous carbon support film. First, on the amorphous carbon support film 1, a particle of W oxide 2, raw material of ultra fine particles of W, is disposed. As the particle of W oxide 2, various kinds of W oxides, for instance $WO_3$, $W_2O_5$, $WO_2$ or the like can be used.

The W oxide such as $WO_3$, being relatively low in the bond strength between W—O, due to an irradiation of an electron beam that will be described later, can produce ultra fine particles of W with reproducibility. Due to the irradiation of an electron beam, oxygen atom is debonded away from the bonding with W. Since the debonded oxygen is reduced by for instance an amorphous carbon support film 1, ultra fine particles of W of high purity can be obtained. From the above reasons, in the present invention, as a raw material for producing the ultra fine particles of W, a particle of W oxide 2 such as that of $WO_3$ is used.

The particle diameter of the ultra fine particles of W 2 is not particularly restricted but is preferable to be in the range of for instance 0.05 to 10 μm. When an initial particle diameter of a particle of W oxide 2 is too small, there is a possibility that ultra fine particles of W can not be sufficiently generated. On the other hand, the initial particle diameter of the particle of W oxide 2, when being too large, even with an electron beam of high intensity that will be described later, may not be uniformly activated.

Next, onto the particle of W oxide 2 disposed on the amorphous carbon support film 1, an electron beam 3 of an intensity of $10^{23}$ to $10^{24}$ e/cm$^2$·sec is irradiated. The electron beam 3 is irradiated in an atmosphere of a high vacuum. In specific, the electron beam 3 is preferable to be irradiated in an atmosphere of $10^{-5}$ Pa or better. Further, during the irradiation of the electron beam 3, a substrate is, without being heated, kept under room temperature.

Upon irradiating the electron beam 3 of such an intensity on the particle of W oxide 2, the particle of W oxide 2 is activated, and the bond between W—O is cut due to electron stimulated desorption (ESD) and a sputtering effect to sputter W and O in the surroundings of the particle of W oxide 2.

In this case, in addition to the atmosphere during the irradiation of the electron beam 3 being a vacuum atmosphere, the particle of W oxide 2 is disposed on the amorphous carbon support film 1 that has a reducing action. Accordingly, the oxygen sputtered from the particle of W oxide 2 is reduced and only W sticks on the amorphous carbon support film 1 in the surroundings as for instance clusters. Thus, ultra fine particles of W 4 are generated.

In order to generate the ultra fine particles of W with reproducibility, it is important to control the intensity of the electron beam 3 being irradiated on the particle of W oxide 2 in the range of $10^{23}$ to $10^{24}$ e/cm$^2$·sec. That is, when the intensity of the electron beam 3 is less than $10^{23}$ e/cm$^2$·sec, energy necessary for cutting bond between W—O, further energy sufficient for sputtering the W that is debonded from the bond as clusters in the surroundings can not be sufficiently given. On these, the atomic weight of W (183.85) and the binding energy of W—O are supposed to affect. In particular, the atomic weight is considered to largely affect.

The electron beam 3 of an intensity of less than $10^{23}$ e/cm$^2$·sec converts only the core of the particle of W oxide 2 into a fine polycrystalline structure, the ultra fine particles 4 of W being not obtained from the particle of W oxide 2 with reproducibility. By contrast, when an intensity of the electron beam 3 exceeds $10^{24}$ e/cm$^2$·sec, the particle of W oxide 2 is damaged due to the irradiation to result in incapability of obtaining the ultra fine particles of W 4 of excellent crystalline state.

Thus, by irradiating an electron beam of an intensity of $10^{23}$ to $10^{24}$ e/cm$^2$·sec on a particle of W oxide 2, ultra fine particles of W 4 of excellent crystalline state can be obtained with reproducibility. The obtained ultra fine particles of W 4 are single crystal particles.

An electron beam of the aforementioned intensity can be obtained by making use of for instance a FE-TEM (Field Emission-Transmission Electron Microscope). The existing TEM can not give an electron beam of the aforementioned intensity. Due to an advent of a FE-TEM, an electron beam 3 of high intensity, in more specific, of an intensity of $10^{23}$ to $10^{24}$ e/cm$^2$·sec is materialized. Thereby, the present invention is made to realize.

An atmosphere during the irradiation of an electron beam 3 on a particle of W oxide 2 is preferable to be a vacuum atmosphere of $10^{-5}$ Pa or better. When the atmosphere during irradiation of the electron beam is $10^{-5}$ Pa or worse, oxygen atoms can not be sufficiently removed. Thereby, W clusters supplied from the particle of W oxide 2 may be oxidized to result in an incapability of generating excellent ultra fine particles of W 4 with reproducibility.

A particle diameter of W ultra fine particles 4 sputtered in the surroundings of the particle of W oxide 2, though different depending on the irradiation intensity of the electron beam 3, is in the range of approximately 1 to 10 nm. Further, the particle diameters of the obtained ultra fine particles of W 4 are relatively uniform. According to the present invention, the ultra fine particles of W 4 of uniform particle diameters of 10 nm or less can be obtained with good reproducibility.

Thus, when irradiating the electron beam 3 of the intensity of $10^{23}$ to $10^{24}$ e/cm$^2$·sec on the particle of W oxide 2 such as WO$_3$ in an atmosphere of high vacuum, ultra fine particles of W 4 consisting essentially of W debonded from the particle of W oxide 2 can be obtained. The obtained ultra fine particles 4 of W are of particle diameters of for instance 10 nm or less and of uniform sizes, being able to sufficiently exhibit characteristics as ultra fine particles.

The ultra fine particles of W 4 of the present invention can be utilized as various kinds of devices and functional materials. For instance, the ultra fine particles of W 4, by utilizing a quantum mechanical effect such as a tunneling effect and a quantum well both appearing therebetween 4, a mini-band, a quantum wire and so on, can be applied in device materials. Further, utilizing characteristics of the ultra fine particles of W 4 themselves, the ultra fine particles of W 4 can be applied in functional materials.

The aforementioned disruption of W—O bond of the particle of W oxide 2 and sputtering of W based thereon are a phenomenon occurring, under ordinary conditions, only at such a high temperature region as exceeding 2000° C. By contrast, in the present invention, due to the irradiation of an electron beam in an atmosphere of a high vacuum, the ultra fine particles of W 4 can be generated from the particle of W oxide 2 on a room temperature stage. In general, it is difficult to irradiate an electron beam under a controlled heating condition. Accordingly, realization of generation of the ultra fine particles of W 4 due to the irradiation of an electron beam on a room temperature stage has a significant meaning.

The ultra fine particles of W 4 obtained due to the irradiation of the electron beam 3 onto the particle of W oxide 2, as shown in FIG. 1, though being able to exist as a single ultra fine particle, can be also bonded into a body in which a plurality of ultra fine particles of W 4 is bonded to each other. Since the ultra fine particles themselves of W 4 deposited on the amorphous carbon support film 1 are in an activated state, each ultra fine particle of W 4 can be mutually bonded.

Figure 2:
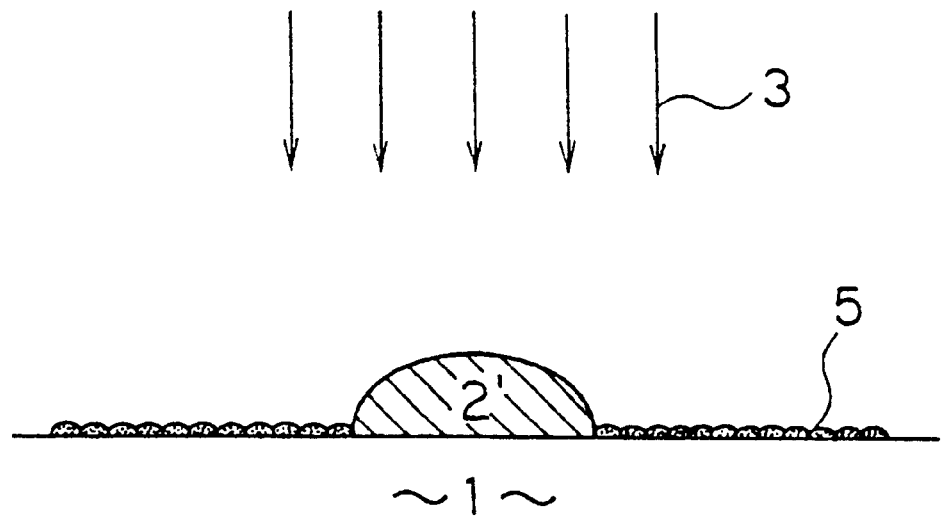
FIG. 2 is a diagram schematically showing a nano-crystal thin film produced from ultra fine particles of W of the present invention.

As a concrete morphology of a bonded body of the ultra fine particles of W 4, as shown in FIG. 2 for example, a film of material in which lots of ultra fine particles of W 4 are bonded to each other, that is a nano-crystal thin film 5 can be cited. The nano-crystal thin film 5 such as described above can be obtained by controlling the period of irradiating the electron beam 3 onto for instance the particle of W oxide 2. At this time, since the amorphous carbon support film 1 is kept at room temperature, the ultra fine particles of W 4 do not show grain growth, the particle diameter of the ultra fine particles of W 4 being approximately maintained. Accordingly, a nano-crystal thin film (ultra thin film) 5 consisting of a bonded body of nano crystal particles approximately maintaining the particle diameter of the generated ultra fine particles of W 4, that is of nano crystal particles of an average particle diameter of 10 nm or less can be obtained.

Thus, in an atmosphere of a high vacuum under room temperature, an electron beam 3 of a high intensity is irradiated onto a particle of W oxide 2 to sputter lots of ultra fine particles of W 4 of a particle diameter of for instance 10 nm or less in the surroundings. Thereby, a nano-crystal thin film 5 having a crystal size nearly maintaining the particle diameter of the ultra fine particles of W can be obtained.

That is, without effecting grain growth from the ultra fine particles of W 4, by directly producing a crystalline film consisting of a bonded body thereof, a nano-crystal thin film 5 of which crystal size is controlled in nanometer-order can be obtained. Such a nano-crystal thin film (ultra thin film) 5, the ultra fine particles of W 4 having excellent chemical, mechanical, electrical and thermal properties, can apply these excellent properties in various kinds of devices and functional materials.

Next, concrete embodiments of the present invention will be described.

Embodiment 1

First, a spherical particle of WO$_3$ (purity=99.8%) of a particle diameter of approximately 90 to 110 nm is prepared as a particle of W oxide, after dispersing in alcohol, being coated on an amorphous carbon support film, followed by drying.

Then, the amorphous carbon support film thereon the particle of WO$_3$ is disposed is set on a room temperature stage set in a vacuum chamber of a FE-TEM. Then, after the inside of the aforementioned vacuum chamber is evacuated to a vacuum of approximately 1×10$^{-6}$ Pa, onto the particle of WO$_3$ disposed on the amorphous carbon support film, an electron beam of 4×10$^{23}$ e/cm$^2$·sec is irradiated for 1 second.

Figure 3:
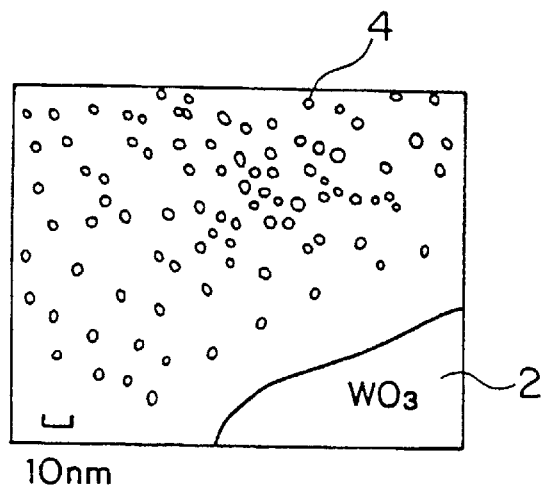
FIG. 3 is a diagram schematically showing a TEM observation after irradiation of an electron beam on a particle of $WO_3$ in embodiment 1 of the present invention.

After irradiating the electron beam, a state in the surroundings of the particle of WO$_3$ is observed with a TEM. As a result, it is confirmed that in the surroundings of the particle of WO$_3$, lots of ultra fine particles of W are generated. In FIG. 3, a result of a TEM observation of the surroundings of the particle of WO$_3$ is schematically shown. As shown in FIG. 3, in the surroundings of the particle of WO$_3$, lots of ultra fine particles of W 4 are generated, some of these existing bonded to each other. Further, these ultra fine particles of W 4 are confirmed, due to TEM observation and electron diffraction analysis, to have an excellent crystalline state.

Figure 4:
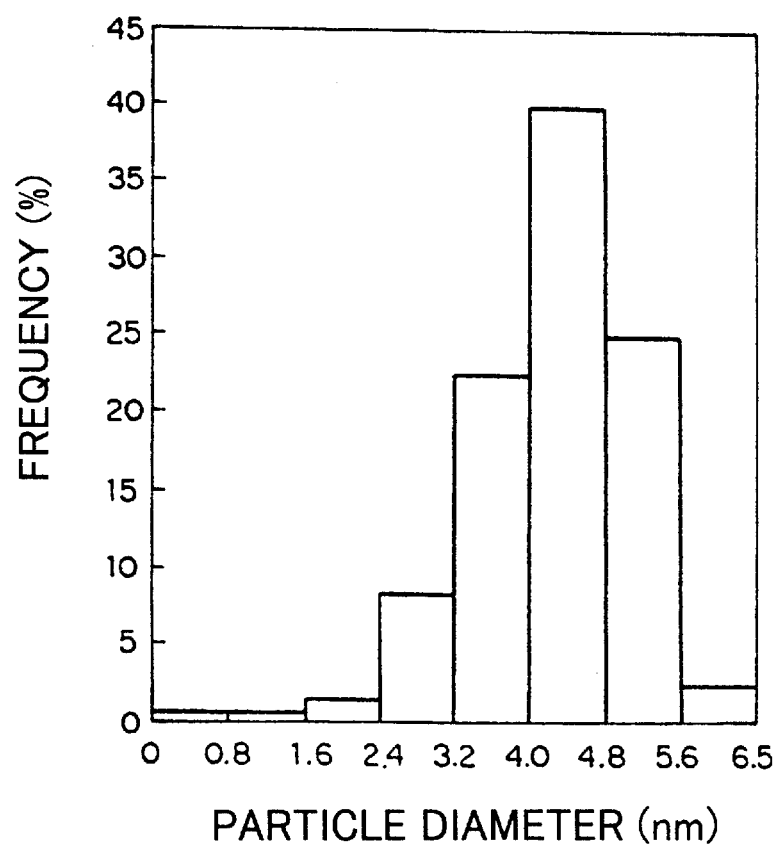
FIG. 4 is a diagram showing measurements of particle diameters of ultra fine particles of W produced in embodiment 1 of the present invention.

The particle diameter of the obtained ultra fine particles of W is measured. The results thereof are shown in FIG. 4. As shown in FIG. 4, the particle diameters of the ultra fine particles of W distribute in the range of approximately 0.8 to 6.5 nm, the fluctuation thereof being small. An average particle diameter of the obtained ultra fine particles of W is 4.3 nm.

On the other hand, as a comparative example of the present invention, with the only exception of the intensity of the electron beam being 1×10$^{20}$ e/cm$^2$·sec, under the identical conditions with embodiment 1, an electron beam is irradiated onto a particle of $WO_3$, ultra fine particles of W being not obtained. Further, even when an electron beam of an intensity exceeding $10^{24}$ e/cm$^2$·sec is irradiated, the ultra fine particles of W 4 such as in embodiment 1 can not be obtained.

Thus, by irradiating an electron beam of an intensity of $10^{23}$ to $10^{24}$ e/cm$^2$·sec onto a particle of $WO_3$ in an atmosphere of high vacuum, adequate energy for obtaining ultra fine particles of W of excellent crystalline state can be given to the particle of $WO_3$. Accordingly, ultra fine particles of W consisting of single crystal particle of excellent crystalline state can be obtained with reproducibility.

Embodiment 2

When, in the aforementioned embodiment 1, a period of irradiation of an electron beam onto a particle of $WO_3$ is prolonged to 3,600 seconds, it is confirmed that a plurality of ultra fine particles of W sputtered in the surroundings of the particle of $WO_3$ are bonded to each other to form a nano-crystal thin film consisting of a bonded body of the ultra fine particles of W.

The obtained nano-crystal thin film is one in which the ultra fine particles of W are bonded to each other while maintaining particle diameters thereof. Individual crystal particle does not show grain growth from the ultra fine particles of W, having a crystal diameter of nanometer-order. An average crystal diameter of the nano-crystal thin film of W is 10 nm or less.

Industrial Applicability

According to the present invention, ultra fine particles of W of a particle diameter of 10 nm or less and of less fluctuation in particle diameter can be obtained with reproducibility. The obtained ultra fine particles of W can be variously controlled as a single body, largely contributing to the study of physical properties and development of applications thereof accordingly.

What is claimed is:

1. A tungsten ultra fine particle system, comprising:

an amorphous carbon film; and a plurality of W ultrafine particles disposed on the amorphous carbon film, and consisting essentially of W atoms and/or W clusters detached from a particle of W oxide by irradiating an electron beam of an intensity of $10^{23}$ to $10^{24}$ e/cm$^2$·sec in an atmosphere of high vacuum to form the W ultra fine particles.

2. The tungsten ultra fine particle system as set forth in claim 1:

wherein the W ultra fine particles have a particle diameter of 10 nm or less.

3. The tungsten ultra fine particle system as set forth in claim 1:

wherein the W ultra fine particles are single crystal particles.

4. The tungsten ultra fine particle as set forth in claim 1: wherein the W ultra fine particles are not bonded to each other.

5. The tungsten ultra fine particle system as set forth in claim 1:

wherein the W ultra fine particles are bonded with each other.

6. The tungsten ultra fine particle system as set forth in claim 5:

wherein the bonded W ultra fine particles compose a nano-crystal thin film having an average crystal diameter of 10 nm or less.

* * * * *

UNITED STATES PATENT AND TRADEMARK OFFICE
CERTIFICATE OF CORRECTION

PATENT NO.    : 6,440,562 B1                                        Page 1 of 1
DATED         : August 27, 2002
INVENTOR(S)   : Tamou et al.

It is certified that error appears in the above-identified patent and that said Letters Patent is hereby corrected as shown below:

<u>Column 8,</u>
Line 6, change "ultrafine" to -- ultra fine --.
Line 21, after "particle" insert -- system --.

Signed and Sealed this

Eighteenth Day of February, 2003

JAMES E. ROGAN
*Director of the United States Patent and Trademark Office*